(12) United States Patent
Xu et al.

(10) Patent No.: US 8,680,860 B2
(45) Date of Patent: Mar. 25, 2014

(54) SYSTEM AND METHOD FOR REDUCING LOCALIZED SIGNAL FLUCTUATION

(75) Inventors: Dan Xu, Oconomowoc, WI (US); Jian Zhang, Rockville, MD (US); Richard Scott Hinks, Waukesha, WI (US); Kevin F. King, Menomonee Falls, WI (US)

(73) Assignee: General Electric Company, Schenectady, NY (US)

( * ) Notice: Subject to any disclaimer, the term of this patent is extended or adjusted under 35 U.S.C. 154(b) by 472 days.

(21) Appl. No.: 12/962,945

(22) Filed: Dec. 8, 2010

(65) Prior Publication Data

US 2012/0146638 A1 Jun. 14, 2012

(51) Int. Cl.
*G01V 3/00* (2006.01)

(52) U.S. Cl.
USPC .......................................... 324/309

(58) Field of Classification Search
USPC .................................. 324/300–322
See application file for complete search history.

(56) References Cited

U.S. PATENT DOCUMENTS

| | | | |
|---|---|---|---|
| 5,378,985 A * | 1/1995 | Hinks ........................... | 324/309 |
| 6,249,120 B1 * | 6/2001 | McKinnon et al. ............ | 324/312 |
| 6,275,040 B1 * | 8/2001 | Zur ................................ | 324/320 |
| 6,373,249 B1 * | 4/2002 | Kwok et al. ................... | 324/306 |

OTHER PUBLICATIONS

Meyer, et al., Simultaneous Spatial and Spectral Selective Excitation, Magnetic Resonance in Medicine 15, 287-304, 1990.*
Conolly et al., "Variable-Rate Selective Excitation," Journal of Magnetic Resonance, vol. 78, pp. 440-458, 1988.
Pauly et al, "Parameter Relations for the Shinnar-Le Roux Selective Excitation Pulse Design Algorithm," IEEE Transactions on Medical Imaging, vol. 10, No. 1, pp. 53-65 , Mar. 1991.
Zur, "Design of Improved Spectral-Spatial Pulses for Routine Clinical Use," Magnetic Resonance in Medicine, vol. 43, pp. 410-420, 2000.

* cited by examiner

*Primary Examiner* — Melissa Koval
*Assistant Examiner* — Daniel Miller
(74) *Attorney, Agent, or Firm* — Ziolkowski Patent Solutions Group, SC

(57) ABSTRACT

A system and method is disclosed for eliminating localized fluctuation artifacts caused by fat signal contamination in MR images, the system includes a magnetic resonance imaging (MRI) system having a plurality of gradient coils positioned about a bore of a magnet, and an RF transceiver system and an RF switch controlled by a pulse module to transmit RF signals to an RF coil assembly to acquire MR images, and a computer programmed to apply a spectral-spatial fat saturation pulse, apply a slice selection gradient pulse, acquire imaging data of an imaging slice of interest, and generate an image.

21 Claims, 7 Drawing Sheets

Spectral profile from spectral-spatial pulse at z=0

Spatial profile from spectral-spatial pulse at -450 Hz with nominal slice thickness of 2 cm

SYSTEM AND METHOD FOR REDUCING LOCALIZED SIGNAL FLUCTUATION

BACKGROUND OF THE INVENTION

Embodiments of the invention relate generally to an apparatus and method of eliminating localized fluctuation artifacts caused by fat signal contamination in MR images.

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, or "longitudinal magnetization", $M_z$, may be rotated, or "tipped", into the x-y plane to produce a net transverse magnetic moment $M_t$. A signal is emitted by the excited spins after the excitation signal $B_1$ is terminated and this signal may be received and processed to form an image.

When utilizing these signals to produce images, magnetic field gradients ($G_x$, $G_y$, and $G_z$) are employed. Typically, the region to be imaged is scanned by a sequence of measurement cycles in which these gradients vary according to the particular localization method being used. The resulting set of received NMR signals is digitized and processed to reconstruct the image using one of many well known reconstruction techniques.

In general it is desirable to image water in an object and suppress fat to avoid fat signal contamination in final images, as known in the art. According to one known method, a spectral spatial water excitation pulse may be applied that generally does not result in artifacts caused by fat. However, such a method is limited in slice thickness and cannot image below approximately 3.1 mm slice thickness.

According to another known technique, fat saturation is in general implemented in a functional MRI (fMRI) pulse sequence to avoid or reduce fat signal contamination in final images. A conventional fat saturation scheme is to use a 90° flip angle, spatially non-selective, 1D RF pulse at fat resonance frequency to rotate fat spins in the whole 3D space (or as far as transmit coil sensitivity goes) to transverse plane. A crusher gradient is then applied to spatially disperse the phase of the rotated fat spins, making their net transverse magnetization in a given imaging voxel negligible. This way of pre-treating fat spins before playing out the subsequent water excitation pulse functions as if the fat signals were "saturated" and would not appear in the water signal based final image, thus the name fat saturation.

This conventional fat saturation scheme relies on a sufficiently strong crusher gradient field to remove fat signals generated by the spatially non-selective RF pulse. At or close to the isocenter of the MR magnet, all X, Y, and Z gradient fields have good linearity in their respective axes and generating a strong crusher gradient in this area is therefore a relatively easy task. However, for locations further away from isocenter in the superior-inferior direction, gradient linearity becomes increasingly worse and in some locations (e.g., >20 cm away from isocenter), gradients at some or all axes can become negligibly small, failing to crush out the fat signals in these areas. For human brain imaging, areas with negligible crusher gradients are below the subject's head, which can include neck and chest areas. Fat spins (or water spins under a $B_0$ frequency offset that equals the fat-water frequency difference) in these areas excited by the spatially non-selective fat saturation pulse (assuming axial scan planes), although not re-flipped by the subsequent water excitation pulse, produce artifactual signals that are aliased to contaminate the in-plane water signal.

In the image domain, the artifactual signals affect one or multiple localized voxels because the imaging gradients that encode these out-of-plane signals have zero or weak amplitude as well. For dynamic imaging that involves acquisition of series of images, such as fMRI, and an artifact manifests itself as an additional temporal fluctuation in one or multiple voxels due to motion and/or system instability in the out-of-plane areas. The locations of voxels with the additional fluctuation are coherent through slices—therefore one or multiple dark bands in the slice direction can appear in the sagittally or coronally reformatted signal-to-temporal-fluctuation-noise (SFNR) map. In fMRI applications, the additional temporal fluctuation can result in false activation points in the brain activation map, which can also largely affect the accuracy of any subsequent data analysis.

It would therefore be desirable to have a system and method capable of reducing localized signal fluctuation.

BRIEF DESCRIPTION OF THE INVENTION

Embodiments of the invention provide a system and method of reducing localized signal fluctuation in fMRI using spectral-spatial fat saturation.

In accordance with one aspect of the invention, an MRI apparatus includes a magnetic resonance imaging (MRI) system having a plurality of gradient coils positioned about a bore of a magnet, and an RF transceiver system and an RF switch controlled by a pulse module to transmit RF signals to an RF coil assembly to acquire MR images, and a computer programmed to apply a spectral-spatial fat saturation pulse, apply a slice selection gradient pulse, acquire imaging data of an imaging slice of interest, and generate an image.

In accordance with another aspect of the invention, a method of MR imaging includes applying a spectral-spatial fat saturation pulse, applying a slice selection gradient pulse, acquiring imaging data of an imaging slice of interest, and generating an image.

In accordance with another aspect of the invention, a computer readable storage medium having stored thereon a computer program comprising instructions which when executed by a computer cause the computer to apply a spectral-spatial fat saturation pulse, apply a slice selection gradient pulse, acquire imaging data of an imaging slice of interest, and generate an image.

Various other features and advantages will be made apparent from the following detailed description and the drawings.

BRIEF DESCRIPTION OF THE DRAWINGS

The drawings illustrate embodiments presently contemplated for carrying out the invention.

In the drawings.

DETAILED DESCRIPTION

A system is shown to reduce localized signal fluctuation in fMRI using spectral-spatial fat saturation.

Figure 1:
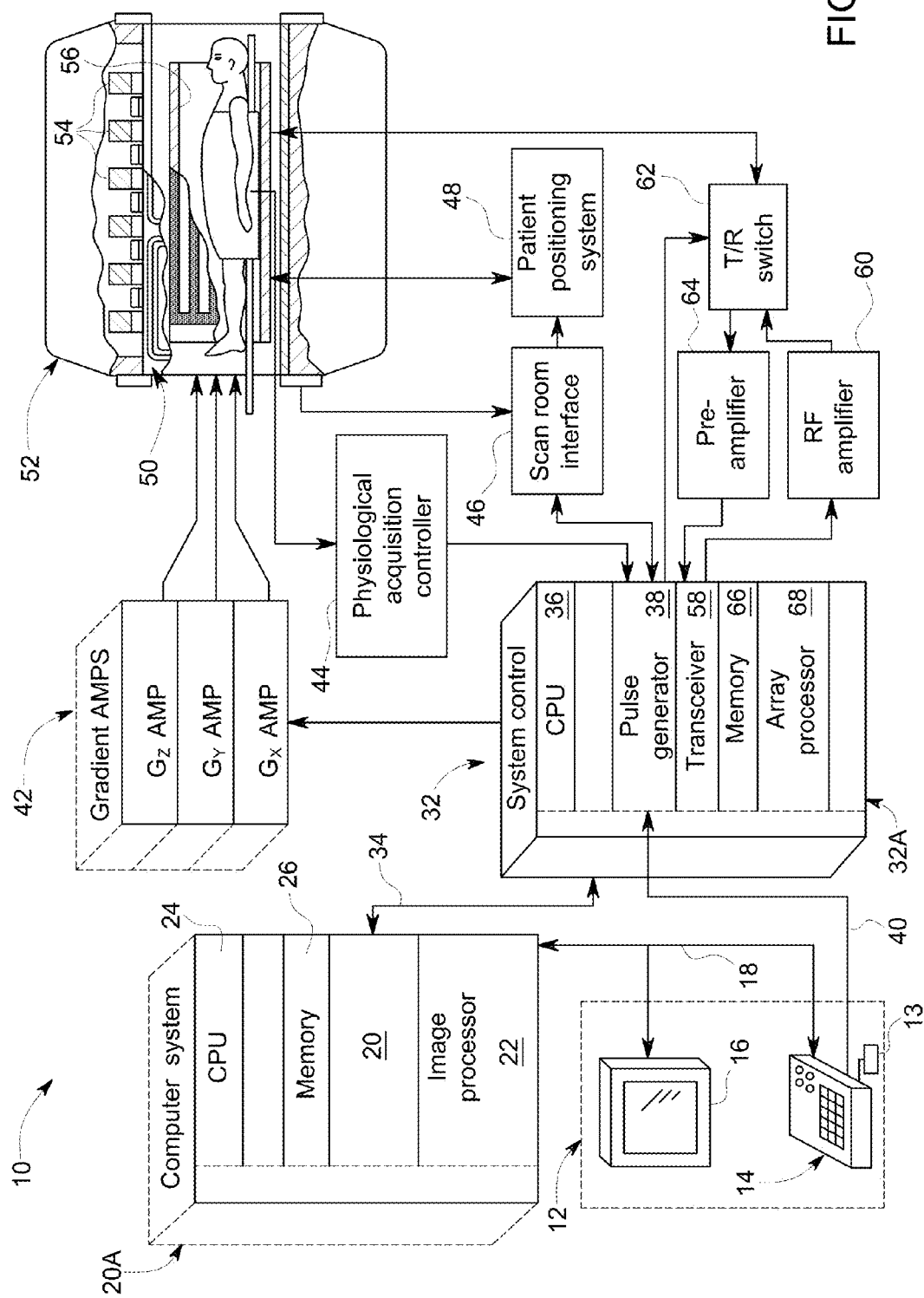
FIG. 1 is a schematic block diagram of an exemplary MR imaging system for use with an embodiment of the invention.

Referring to FIG. 1, the major components of a magnetic resonance imaging (MRI) system 10 incorporating an embodiment of the invention are shown. The operation of the system is controlled for certain functions from an operator console 12 which in this example includes a keyboard or other input device 13, a control panel 14, and a display screen 16. The console 12 communicates through a link 18 with a separate computer system 20 that enables an operator to control the production and display of images on the display screen 16. The computer system 20 includes a number of modules which communicate with each other through a backplane 20a. These modules include an image processor module 22, a CPU module 24 and a memory module 26, known in the art as a frame buffer for storing image data arrays. The computer system 20 communicates with a separate system control 32 through a high speed serial link 34. The input device 13 can include a mouse, joystick, keyboard, track ball, touch activated screen, light wand, voice control, card reader, push-button, or any similar or equivalent input device, and may be used for interactive geometry prescription.

The system control 32 includes a set of modules connected together by a backplane 32a. These include a CPU module 36 and a pulse generator module 38 which connects to the operator console 12 through a serial link 40. It is through link 40 that the system control 32 receives commands from the operator to indicate the scan sequence that is to be performed. The pulse generator module 38 operates the system components to carry out the desired scan sequence and produces data which indicates the timing, strength and shape of the RF pulses produced, and the timing and length of the data acquisition window. The pulse generator module 38 connects to a set of gradient amplifiers 42, to indicate the timing and shape of the gradient pulses that are produced during the scan. The pulse generator module 38 can also receive patient data from a physiological acquisition controller 44 that receives signals from a number of different sensors connected to the patient, such as ECG signals from electrodes attached to the patient. And finally, the pulse generator module 38 connects to a scan room interface circuit 46 which receives signals from various sensors associated with the condition of the patient and the magnet system. It is also through the scan room interface circuit 46 that a patient positioning system 48 receives commands to move the patient to the desired position for the scan.

The gradient waveforms produced by the pulse generator module 38 are applied to the gradient amplifier system 42 having Gx, Gy, and Gz amplifiers. Each gradient amplifier excites a corresponding physical gradient coil in a gradient coil assembly generally designated 50 to produce the magnetic field gradients used for spatially encoding acquired signals. The gradient coil assembly 50 forms part of a resonance assembly 52 which includes a polarizing magnet 54 and a whole-body RF coil 56. A transceiver module 58 in the system control 32 produces pulses which are amplified by an RF amplifier 60 and coupled to the RF coil 56 by a transmit/receive switch 62. The resulting signals emitted by the excited nuclei in the patient may be sensed by the same RF coil 56 and coupled through the transmit/receive switch 62 to a preamplifier 64. The amplified MR signals are demodulated, filtered, and digitized in the receiver section of the transceiver 58. The transmit/receive switch 62 is controlled by a signal from the pulse generator module 38 to electrically connect the RF amplifier 60 to the coil 56 during the transmit mode and to connect the preamplifier 64 to the coil 56 during the receive mode. The transmit/receive switch 62 can also enable a separate RF coil (for example, a surface coil) to be used in either the transmit or receive mode.

The MR signals picked up by the RF coil 56 are digitized by the transceiver module 58 and transferred to a memory module 66 in the system control 32. A scan is complete when an array of raw k-space data has been acquired in the memory module 66. This raw k-space data is rearranged into separate k-space data arrays for each image to be reconstructed, and each of these is input to an array processor 68 which operates to Fourier transform the data into an array of image data. This image data is conveyed through the serial link 34 to the computer system 20 where it is stored in memory. In response to commands received from the operator console 12 or as otherwise directed by the system software, this image data may be archived in long term storage or it may be further processed by the image processor 22 and conveyed to the operator console 12 and presented on the display 16.

According to embodiments of the invention, a spectral-spatial fat saturation pulse may be applied to remove localized fluctuation artifact due to fat signal contamination. Specifically, a conventional spatially non-selective, 1D saturation pulse is replaced with a 2D spectral-spatial saturation pulse. In the spectral domain, the 2D pulse selects generally spins whose resonance frequencies are close to the fat frequency; in the spatial domain, as illustrated in FIG. 2, the 2D pulse selects a slice that is centered on the imaging slice of interest (i.e., the slice excited by the subsequent water excitation pulse) but with a wider slice thickness to ensure fat spins inside the imaging slice are fully saturated.

Figure 2:
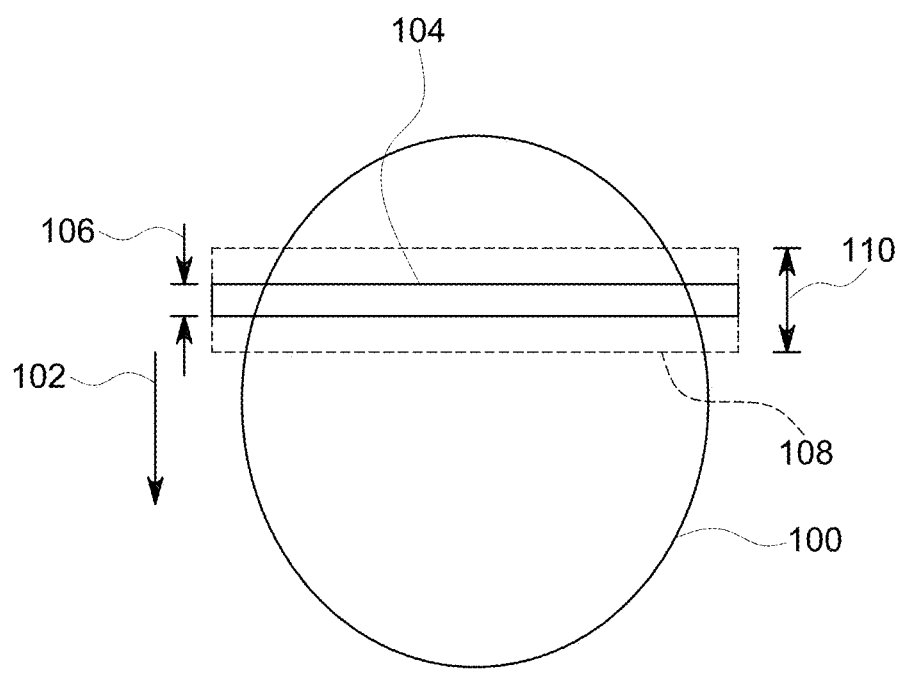
FIG. 2 is illustrated a head having illustrated therein a slice-of-interest and a corresponding spectral-spatial fat saturation RF pulse

Referring now to FIG. 2, a head 100 is illustrated as part of a body (not shown) having illustrated therein a slice-of-interest corresponding to water excitation and a slice corresponding to fat saturation. Along a slice direction 102 a slice-of-interest 104 is a slice that is excited by a water excitation RF pulse having a slice thickness 106. Corresponding to a location of slice of interest 104 within head 100, a slice 108 having a width 110 (that is greater than that of slice thickness 106) is approximately centered on slice of interest 104, is selected based thereon, and is a result of a spectral-spatial fat saturation pulse. Note that slice 108 saturated by the spectral-spatial pulse moves along with the location of slice-of-interest 104 when acquiring off-centered slices. Owing to the spatial selectivity, fat spins far off isocenter (e.g., spins in the neck or chest) would not be excited and therefore not aliased back to the imaging plane to create the signal fluctuation artifact.

Figure 3:
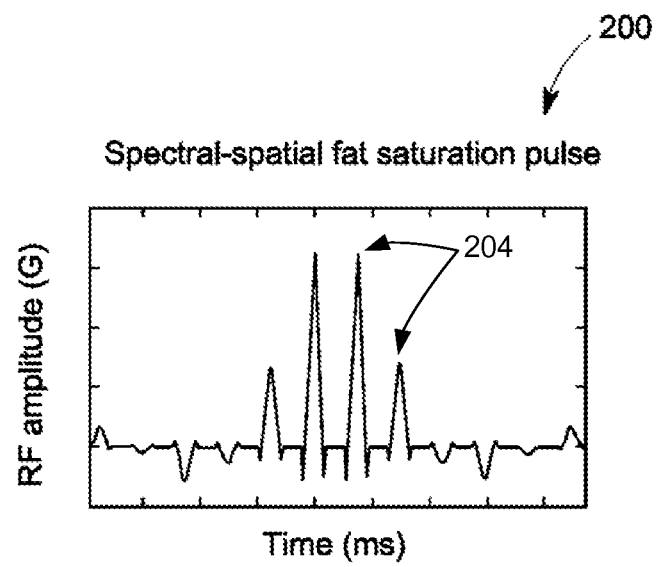
FIG. 3 is a spectral-spatial pulse based on an echo-planar excitation k-space trajectory.

The spectral-spatial pulse may be based on an echo-planar excitation k-space trajectory using methods known in the art. In one example, FIG. 3 shows a spectral-spatial pulse 200 based on an echo-planar excitation k-space trajectory using a method described in Y. Zur, "Design of improved spectral-spatial pulses for routine clinical use", *Magn. Reson. Med.*, vol. 43, pp. 410-420, 2000. And, although a bipolar gradient design can be used, for simplicity and robustness, a unipolar design (also called the "flyback" design) of slice gradients 202 (illustrated in FIG. 4) is shown where RF pulse is non-zero at only the positive gradients.

According to this example, a prototype 1D subpulse is first designed using the Shinnar-Le Roux algorithm (J. Pauly, P. Le Roux, D. Nishimura, A. Macovski, "Parameter relations for Shinnar-Le Roux selective excitation pulse design algorithm", *IEEE Trans. Med. Imaging*, vol. 10, pp. 53-65, 1991.) having a time-bandwidth product of 2.5, in-slice ripple of 2%, and out-of-slice ripple of 5%. The prototype subpulse is then replicated 12 times 204, each with a proper weight determined also by the Shinnar-Le Roux algorithm to generate a desired spectral excitation profile. Each subpulse 204 corresponds to one positive gradient lobe, and zeros are filled in between two neighboring subpulses 204 to generate the final RF pulse. Note that for all 12 positive gradient lobes, the maximum gradient amplitude is determined by the spatial bandwidth of the pulse and the desired slice thickness (2 cm for the given example), and a VERSE algorithm (as described in S. M. Conolly, D. G. Nishimura, A. Macovski, "Variable-rate selective excitation", J Magn. Reson., vol. 78, pp. 440-458, 1988) may be used to shorten the positive gradient waveform length by playing out each subpulse on both the plateau and ramps of each trapezoidal gradient.

Figure 4:
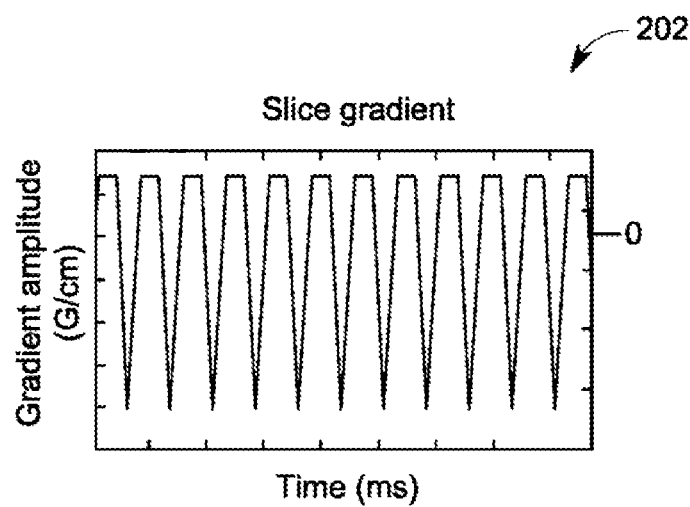
FIG. 4 is a unipolar design of slice gradients.

To further reduce pulse width, negative gradient lobes are designed using the maximum available gradient amplitude and slew rate (i.e., traverse back in k-space as fast as the hardware allows), thus the asymmetric shape of the whole gradient waveform in FIG. 4, which includes a plurality of positive gradient subpulses whose highest amplitudes are determined by a spatial bandwidth of an RF pulse and based on a desired slice thickness. In this example, remaining parameters used in the design include: spectral bandwidth=560 Hz, distance between two neighboring spectral lobes=1.35 kHz, main lobe ripple for spectral profile=2%, side lobe ripple for spectral profile=10%. Parameters are chosen assuming a 3T main magnetic field strength, maximum gradient amplitude=4 G/cm, and maximum gradient slew rate=15000 G/cm/s. Pulse 200 may be played at the fat resonance frequency when used for fat saturation. And, to obtain a given off-centered slice location at $z=z_0$ using the spectral-spatial pulse 200, a shaped frequency modulation $\gamma G(t)z_0$ need only be described, as described in Y. Zur, "Design of improved spectral-spatial pulses for routine clinical use", *Magn. Reson. Med.*, vol. 43, pp. 410-420, 2000, where γ is the gyromagnetic ratio of proton and G(t) is the echo planar gradient waveform (FIG. 4).

Figure 5:
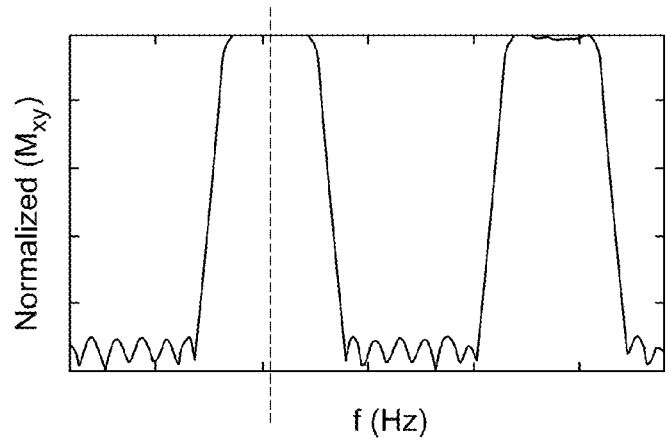
FIG. 5 is a spectral profile from the spectral-spatial pulse of FIG. 3.
Figure 6:
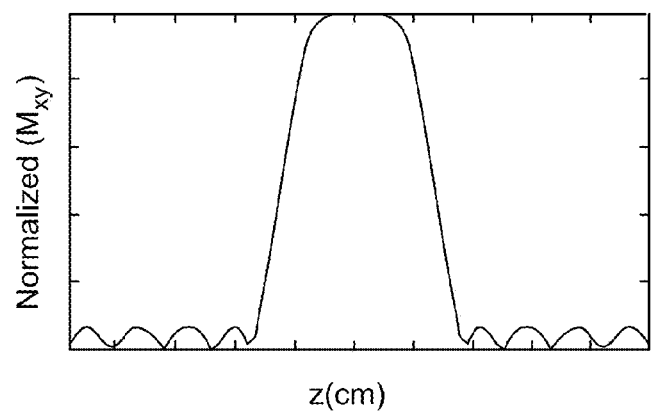
FIG. 6 is a spatial profile from the spectral-spatial pulse of FIG. 3.

In the example, Bloch simulation is done using each of the two pulses shown in FIGS. 3 and 4, and the magnitude transverse magnetizations $|M_{xy}|$ normalized by the equilibrium magnetization $M_0$ are shown in FIGS. 5 and 6. For the spectral-spatial pulse 200, the 1D spectral profile at z=0 (i.e., slice center where z denotes a slice axis 102) is shown in FIG. 5, where the main lobe is centered on the fat resonance frequency at 3T (f=−450 Hz where f denotes frequency offset from water resonance frequency) and there are infinite number of aliasing lobes (only one shown in the FIG. 5) due to the discrete nature of sampling in time for f (where a sampling interval equals a distance between two neighboring subpulses). The aliasing lobes do not affect fat saturation or water excitation performance because their locations are far off the frequencies of fat and water spins. FIG. 6 shows the 1D spatial profile at f=−450 Hz with 2 cm nominal slice thickness. The main lobe is to ensure good in-slice fat saturation, while the small ripples outside of main lobe show good suppression of any fat signal in these regions.

Figure 7:
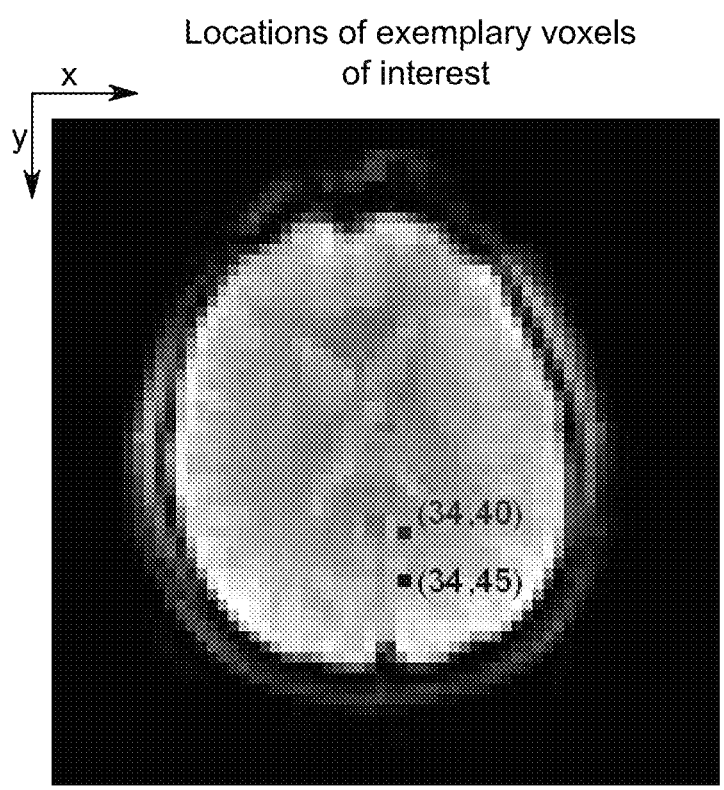
FIG. 7 is an arbitrarily chosen slice of an image having two voxels of interest for further illustration.

In one example, comparison may be made between voxels of images acquired using a conventional 1D fat saturation method and voxels of images acquired using a spectral-spatial fat saturation (acquired using an embodiment of the invention). Pulse shapes may be used in the example provided in FIGS. 3 and 4, and scan parameters include an axial scan plane having a matrix size of 64×64, a slice thickness for water excitation of 0.25 cm, a slice thickness for fat saturation (when the spectral-spatial pulse is used) of 2 cm, a number of slices of 25, a number of temporal phases of 140, a TR of 1400 ms, a TE of 18 ms, and a total scan time of 3 minutes, 16 seconds. FIG. 7 shows an arbitrarily chosen slice obtained in this example where two voxels of interest are picked for further illustration. One voxel is selected at voxel (34,40), where x represents the readout axis and y represents the phase encoding axis, and the other voxel is selected at voxel (34,45).

Figure 8:
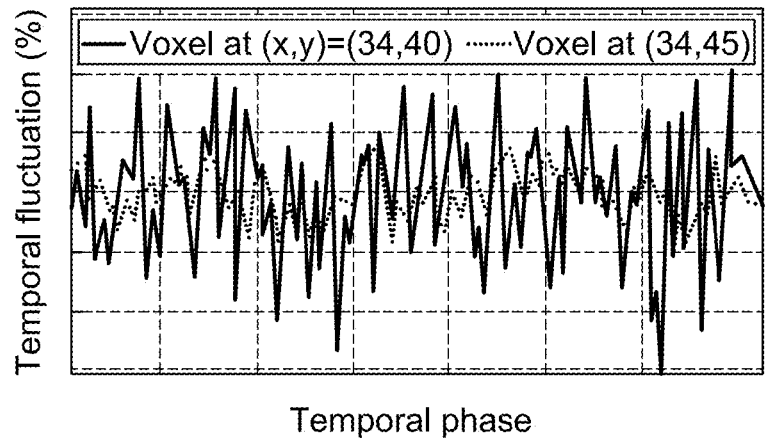
FIG. 8 is a comparison of a temporal profile at two voxels of interest obtained using a conventional 1D spatially non-selective fat saturation.

FIG. 8 compares a temporal profile of the signal at the two voxels of interest for images acquired using a conventional 1D spatially non-selective fat saturation.

After a second order polynomial detrending in the temporal phase axis, the normalized temporal fluctuation, defined as (current signal - temporal mean)/(temporal mean), has a significantly higher value in the voxel (34, 40) (calculated as the average absolute value of fluctuation) than voxel (34, 45), because voxel (34, 40) is contaminated with additional fat signal fluctuation from outside the brain.

Figure 9:
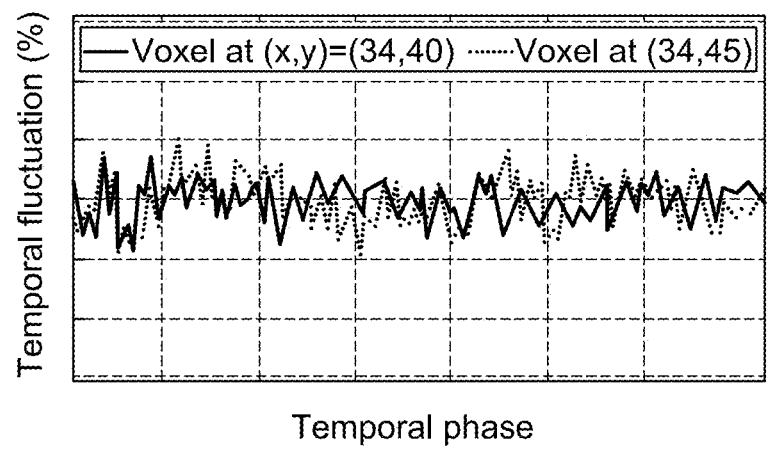
FIG. 9 is a comparison of a temporal profile at two voxels of interest obtained using a spectral-spatial fat saturation according to an embodiment of the invention.
Figure 10:
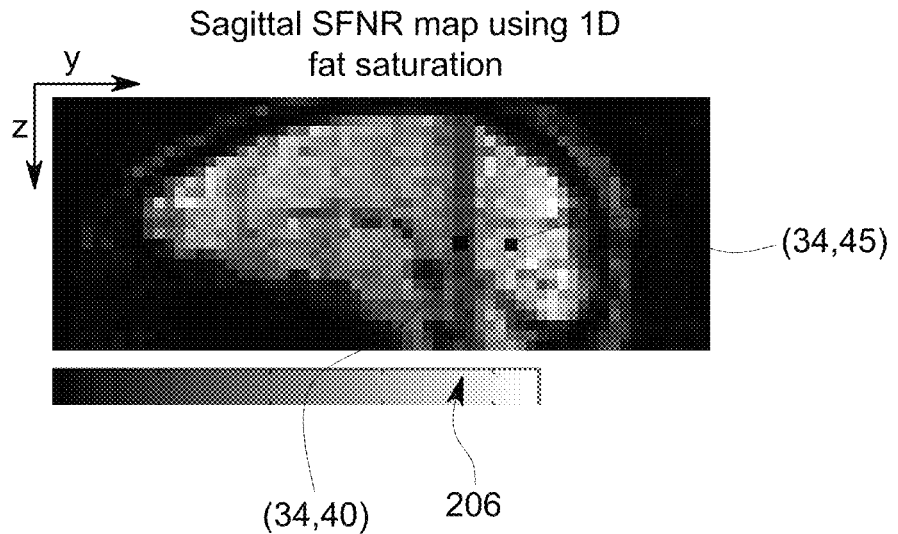
FIG. 10 is a sagitally reformatted map based on 1D fat saturation images illustrating a vertical band having high temporal fluctuation.
Figure 11:
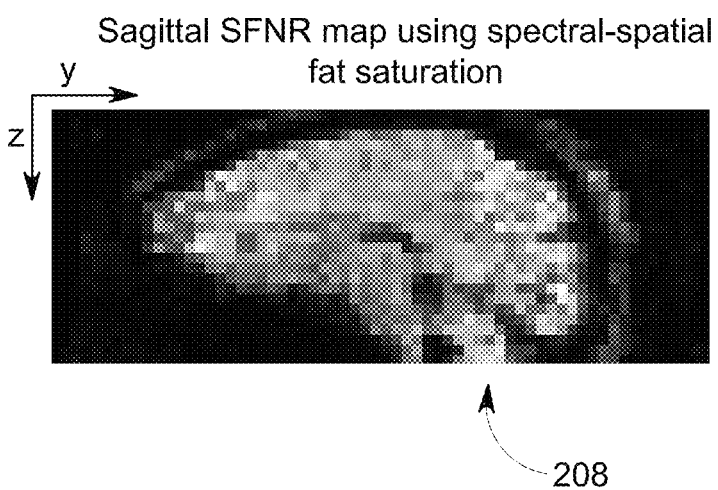
FIG. 11 is a sagitally reformatted map based on a spectral-spatial fat saturation according to an embodiment of the invention and having low temporal fluctuation.

FIG. 9 compares the same two voxels, (34, 40) and 34, 45), for images using the spectral-spatial fat saturation obtained according to an embodiment of the invention. Both voxels, (34, 40) and (34, 45), have similar temporal fluctuation values, indicating a suppression of additional fluctuation from fat signal outside the brain. Temporal fluctuations may be evaluated at every voxel in every slice and represented by a 3D SFNR map (where each voxel of the map is defined as the temporal average of the signal at that voxel divided by the temporal standard deviation of the signal at the same voxel). Darker color in the map typically means larger fluctuation while lighter color typically means lower fluctuation. One layer (x=34) of the sagittally reformatted map (phase encoding axis y is in horizontal direction and slice axis z is in vertical direction) based on the 1D fat saturation images is shown in FIG. 10. A dark vertical band 206 corresponds to the same voxels across all slices that have significantly higher temporal fluctuation. Voxel (34, 40) was selected, for illustrative purposes, inside the dark band 206 and voxel (34, 45) was selected outside of vertical band 206. Dark band 206 does not appear 208 in the SFNR map using the spectral-spatial fat saturation obtained according to an embodiment of the invention (FIG. 11), which not only shows that embodiments of the invention are capable of removing localized additional temporal fluctuation, but also that additional fluctuation is from signal outside the brain because spatial suppression of such signal reduces the overall fluctuation to a normal level. Note that remaining sporadic dark dots in the sagittally reformatted map are due to low signal in the corresponding anatomies.

It is to be noted that a length of a dark band may reduce as the slice thickness decreases, and may become negligible when slice thickness is 3 cm or less. However, an overly thin slice (e.g., 1 cm) can compromise in-plane fat saturation performance because a flattop of the spatial profile (FIG. 5) may be very close to a water excitation slice thickness; thus any small misalignment between a water excitation slice and a fat saturation slice would leave residual fat signal in the imaging slice. Therefore, there is a tradeoff between removal of the localized fluctuation artifact and in-space fat saturation performance. For typical thin slice applications (e.g., water excitation slice thickness of 3 mm or less), a 2 cm fat slice thickness gives robust fat saturation while fully removing the localized fluctuation artifact. Because the dark band typically reduces its length from the top further suggests that the source of the fluctuation is from signal below the imaging slices (e.g., neck or chest).

In summary, the disclosed spectral-spatial fat saturation method avoids unnecessary fat spin excitation outside the imaging volume by spatially selective excitation in the slice direction, thereby avoiding an aliasing fat signal that causes localized signal fluctuation in fMRI. The spectral-spatial pulse can be designed to have pulse length and spectral profile similar to those of a conventional 1D fat saturation pulse, therefore maintaining similar sequence time and fat saturation performance. The spectral-spatial pulse normally has higher maximum RF amplitude than the 1D pulse, which may only limit design parameters such as time-bandwidth product of the subpulse (related to the sharpness of the spatial profile) and will not raise concerns on specific absorption rate (SAR) in general because of the relatively long repetition time typically used in fMRI pulse sequences.

Although only EPI-based fMRI results have been discussed, the proposed method should also be applicable to spiral-based fMRI for fat suppression.

A technical contribution for the disclosed method and apparatus is that is provides for a computer implemented apparatus and method of eliminating localized fluctuation artifacts caused by fat signal contamination in MR images.

One skilled in the art will appreciate that embodiments of the invention may be interfaced to and controlled by a computer readable storage medium having stored thereon a computer program. The computer readable storage medium includes a plurality of components such as one or more of electronic components, hardware components, and/or computer software components. These components may include one or more computer readable storage media that generally stores instructions such as software, firmware and/or assembly language for performing one or more portions of one or more implementations or embodiments of a sequence. These computer readable storage media are generally non-transitory and/or tangible. Examples of such a computer readable storage medium include a recordable data storage medium of a computer and/or storage device. The computer readable storage media may employ, for example, one or more of a magnetic, electrical, optical, biological, and/or atomic data storage medium. Further, such media may take the form of, for example, floppy disks, magnetic tapes, CD-ROMs, DVD-ROMs, hard disk drives, and/or electronic memory. Other forms of non-transitory and/or tangible computer readable storage media not list may be employed with embodiments of the invention.

A number of such components can be combined or divided in an implementation of a system. Further, such components may include a set and/or series of computer instructions written in or implemented with any of a number of programming languages, as will be appreciated by those skilled in the art. In addition, other forms of computer readable media such as a carrier wave may be employed to embody a computer data signal representing a sequence of instructions that when executed by one or more computers causes the one or more computers to perform one or more portions of one or more implementations or embodiments of a sequence.

According to one embodiment of the invention, an MRI apparatus includes a magnetic resonance imaging (MRI) system having a plurality of gradient coils positioned about a bore of a magnet, and an RF transceiver system and an RF switch controlled by a pulse module to transmit RF signals to an RF coil assembly to acquire MR images, and a computer programmed to apply a spectral-spatial fat saturation pulse, apply a slice selection gradient pulse, acquire imaging data of an imaging slice of interest, and generate an image.

According to another embodiment of the invention, a method of MR imaging includes applying a spectral-spatial fat saturation pulse, applying a slice selection gradient pulse, acquiring imaging data of an imaging slice of interest, and generating an image.

According to yet another embodiment of the invention, a computer readable storage medium having stored thereon a computer program comprising instructions which when executed by a computer cause the computer to apply a spectral-spatial fat saturation pulse, apply a slice selection gradient pulse, acquire imaging data of an imaging slice of interest and generate an image.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. An MRI apparatus comprising:
   a magnetic resonance imaging (MRI) system having a plurality of gradient coils positioned about a bore of a magnet, and an RF transceiver system and an RF switch controlled by a pulse module to transmit RF signals to an RF coil assembly to acquire MR images; and
   a computer programmed to:
      identify an imaging slice of interest, the imaging slice of interest having a first thickness;
      apply a 2D spectral-spatial fat saturation pulse that is spatially limited to a fat saturation slice centered on the imaging slice of interest but having a second thickness that is greater than the first thickness, wherein applying the 2D spectral-spatial fat saturation pulse comprises:
         applying a plurality of RF subpulses; and
         applying a slice selection gradient pulse;
      apply a water excitation pulse that is spatially limited to the imaging slice of interest;
      acquire imaging data of the imaging slice of interest based on the applied 2D spectral-spatial fat saturation pulse and the applied water excitation pulse; and
      generate an image from the acquired imaging data of the imaging slice of interest.

2. The MRI apparatus of claim 1 wherein the computer is programmed to determine the spectral-spatial fat saturation pulse having a resonance that is based on a fat frequency.

3. The MRI apparatus of claim 1 wherein the computer is programmed to determine a spatial width and a spatial location of the spectral-spatial fat saturation pulse based on the imaging slice of interest.

4. The MRI apparatus of claim 1 wherein the computer is programmed to determine the slice selection gradient pulse based on the spectral-spatial fat saturation pulse.

5. The MRI apparatus of claim 1 wherein the slice selection gradient pulse includes a plurality of positive gradient lobes whose highest amplitudes are determined by a spatial bandwidth of an RF pulse and based on a desired slice thickness, with each of the plurality of RF subpulses corresponding to one positive gradient lobe in the slice selection gradient pulse.

6. The MRI apparatus of claim 1 wherein the slice selection gradient pulse includes a plurality of negative gradient lobes that are designed based on a maximum available gradient amplitude and based on a slew rate.

7. The MRI apparatus of claim 5 wherein a spatial profile of magnetization excited by the spectral-spatial pulse comprises a main lobe configured to saturate fat in the fat saturation slice and a plurality of ripples outside of the main lobe configured to prevent the formation of any fat signal outside of the fat saturation slice.

8. The MRI apparatus of claim 1 wherein the computer is programmed to acquire a series of images of the imaging slice of interest according to a functional MRI (fMRI) technique so as to assess functioning of the imaging slice of interest, with the 2D spectral-spatial fat saturation pulse eliminating an aliasing fat signal from a region outside the imaging slice of interest that can cause localized signal fluctuation in a sagittally or coronally reformatted signal-to-temporal-fluctuation-noise (SFNR) map generated from the series of images.

9. A method of functional MR imaging (fMRI) in which a series of images of an imaging slice of interest are acquired to assess functioning of an area of interest, the method comprising:
   identifying an imaging slice of interest, the imaging slice of interest having a first thickness;
   applying a 2D spectral-spatial fat saturation pulse that is spatially limited to a fat saturation slice centered on the imaging slice of interest but having a second thickness that is greater than the first thickness, wherein applying the 2D spectral-spatial fat saturation pulse comprises:
      applying a plurality of RF subpulses at a frequency close to or equal to a fat frequency; and
      applying a slice selection gradient pulse;
   acquiring imaging data of an imaging slice of interest based on the applied 2D spectral-spatial fat saturation pulse; and
   generating an image from the acquired imaging data of the imaging slice of interest;
   wherein the 2D spectral-spatial fat saturation pulse eliminates an aliasing fat signal from a region outside the imaging slice of interest that can cause localized signal fluctuation.

10. The method of claim 9 comprising determining the spectral-spatial fat saturation pulse to have a resonance that is based on a fat frequency.

11. The method of claim 9 comprising determining a spatial width and a spatial location of the spectral-spatial fat saturation pulse based on the imaging slice of interest.

12. The method of claim 9 comprising determining the slice selection gradient pulse based on the spectral-spatial fat saturation pulse.

13. The method of claim 9 comprising determining the slice selection gradient to include a slice thickness that is greater than a slice thickness of a water excitation pulse.

14. The method of claim 9 comprising determining the slice selection gradient pulse to include a plurality of positive gradient lobes whose highest amplitudes are determined by a spatial bandwidth of an RF pulse and based on a desired slice thickness.

15. The method of claim 9 comprising determining the slice selection gradient pulse to include a plurality of negative gradient lobes that are designed based on a maximum available gradient amplitude and based on a slew rate.

16. A non-transitory computer readable storage medium having stored thereon a computer program comprising instructions which when executed by a computer cause the computer to:
   set a first thickness for an imaging slice of interest;
   apply a 2D spectral-spatial fat saturation pulse that is spatially limited to a fat saturation slice centered on the imaging slice of interest but having a second thickness that is greater than the first thickness, wherein applying the 2D spectral-spatial fat saturation pulse comprises:
      applying a plurality of RF subpulses; and
      applying a slice selection gradient pulse;
   apply a water excitation pulse that is spatially limited to the imaging slice of interest;
   acquire imaging data of an imaging slice of interest based on the applied 2D spectral-spatial fat saturation pulse and the applied water excitation pulse; and
   generate an image from the acquired imaging data of the imaging slice of interest.

17. The non-transitory computer readable storage medium of claim 16 wherein the computer is caused to determine the spectral-spatial fat saturation pulse having a resonance that is based on a fat frequency.

18. The non-transitory computer readable storage medium of claim 16 wherein the computer is caused to determine a spatial width and a spatial location of the spectral-spatial fat saturation pulse based on the imaging slice of interest.

19. The non-transitory computer readable storage medium of claim 16 wherein the computer is caused to determine the slice selection gradient pulse based on the spectral-spatial fat saturation pulse.

20. The non-transitory computer readable storage medium of claim 16 wherein the slice selection gradient pulse includes a plurality of positive gradient lobes whose highest amplitudes are determined by a spatial bandwidth of an RF pulse and based on a desired slice thickness.

21. The non-transitory computer readable storage medium of claim 16 wherein the slice selection gradient pulse includes a plurality of negative gradient lobes that are designed based on a maximum available gradient amplitude and based on a slew rate.

* * * * *